United States Patent
Tan

(10) Patent No.: US 8,210,875 B2
(45) Date of Patent: Jul. 3, 2012

(54) ECO CONTACTOR

(75) Inventor: Yean Hong Tan, Bayan Lepas (MY)

(73) Assignee: Test Tooling Solutions (M) SDN BHD, Bayan Lepas, Pulau Pinang (MY)

( * ) Notice: Subject to any disclaimer, the term of this patent is extended or adjusted under 35 U.S.C. 154(b) by 0 days.

(21) Appl. No.: 12/746,699

(22) PCT Filed: Dec. 5, 2008

(86) PCT No.: PCT/MY2008/000179
§ 371 (c)(1),
(2), (4) Date: Aug. 25, 2010

(87) PCT Pub. No.: WO2009/072864
PCT Pub. Date: Jun. 11, 2009

(65) Prior Publication Data
US 2010/0311274 A1 Dec. 9, 2010

(30) Foreign Application Priority Data
Dec. 6, 2007 (MY) .............................. PI20072178

(51) Int. Cl.
*H01R 13/648* (2006.01)
(52) U.S. Cl. .................................... 439/607.05; 439/66
(58) Field of Classification Search ............. 439/607.05, 439/607.08, 66
See application file for complete search history.

(56) References Cited

U.S. PATENT DOCUMENTS

| | | | | |
|---|---|---|---|---|
| 4,547,834 A * | 10/1985 | Dumont et al. | ............... | 361/722 |
| 5,718,040 A * | 2/1998 | Faure et al. | ..................... | 29/846 |
| 5,945,836 A | 8/1999 | Sayre et al. | | |
| 6,094,115 A * | 7/2000 | Nguyen et al. | ................ | 333/260 |
| 6,464,511 B1 * | 10/2002 | Watanabe et al. | ............... | 439/66 |
| 6,652,326 B2 * | 11/2003 | Boyle et al. | ................... | 439/700 |
| 6,902,410 B2 * | 6/2005 | Watanabe | ........................ | 439/66 |
| 6,911,833 B2 | 6/2005 | Tan et al. | | |
| 2001/0011897 A1 | 8/2001 | Hamel et al. | | |
| 2003/0139071 A1 * | 7/2003 | Li et al. | ............................ | 439/66 |
| 2004/0043653 A1 | 3/2004 | Feldman | | |
| 2005/0233610 A1 * | 10/2005 | Tutt et al. | ......................... | 439/66 |
| 2006/0141815 A1 * | 6/2006 | Li | .................................... | 439/66 |
| 2007/0004238 A1 | 1/2007 | Breininger et al. | | |

FOREIGN PATENT DOCUMENTS

GB        1416950        12/1975

OTHER PUBLICATIONS

International Search Report of PCT International Application No. PCT/MY2008/000179 mailed Apr. 14, 2009.
Written Opinion of PCT International Application No. PCT/MY2008/000179 mailed Apr. 14, 2009.

* cited by examiner

*Primary Examiner* — Hien Vu
(74) *Attorney, Agent, or Firm* — Hamre, Schumann, Mueller & Larson, P.C.

(57) ABSTRACT

The present invention relates to an improved a shielded contactor having an insulative material or proxy (9a, 9b) for making reliable electrical contact. Accordingly, the length of the assembled contactor is totally surrounded by conductive material, thereby providing shielding element. Resultantly, the present invention has the capability of eliminating impedance mismatch during the signal transmission.

5 Claims, 4 Drawing Sheets

ECO CONTACTOR

TECHNICAL FIELD

A contactor is provided to couple a device under test, and more particularly, a shielded contactor is provided having an insulative material or more specifically relating to structures for making reliable electrical contact thereto.

BACKGROUND

A wide variety of contactors currently is available for use such as the conventional plastic contactors and/or partially shielded contactors are amongst those widely used in the market.

Many of these shielding devices are constructed of relatively thin flexible sheets of metal and utilize spring contactors for making electrical contact at multiple locations to effect ground connections in various shielding arrangements.

Shielding is a founded on coaxial theory, wherein by shorting the housing to the ground pins, a virtual ground plane will be created around the signal pins to provide a good control over the impedance which is a major contributor in determining the performance of the contactor.

One commercially available contactor known as partially shielded contactors consist of three plates. The middle plate, made of conductive materials, are shorter to the ground pins thus creating a virtual ground plane that shields the signal pin at a constant impedance. The top plate and bottom plate, made of engineered plastic materials, are to hold the pins in position and prevent them from shorting to ground. In order to obtain good control over the impedance of a partially shielded contactor would be to maximize the shielding percentage by reducing the plastic materials plates so as long as it does not compromise the mechanical structures of the contactor.

It would be highly desirable to have that can be aligned with contact pads if 100% shielding is achieved. Nevertheless, the limiting factor in the currently available contactors, one is not able to achieve 100% shielding factor as the thicknesses of the plastic plates are totally dependent on the mechanical limitation and requirements of the sockets.

It would also be desirable to have such a contactor which is less susceptible to damage. To achieve such a 100% Shielding Factor, the housing must be fully made from conductive metal.

In doing so, steps and measures are taken to prevent the signal pins from being shorted to housing as this may cause improper setup and faulty device.

BRIEF SUMMARY

The disclosure provides an epoxy-sealed contactor in overcoming the aforesaid issues and to achieve a 100% shielding factor. Then, an insulative material inserted into the Contactor to prevent the Signal pins from being shorted to ground. By doing so, the mechanical limitations constricted to the partially shielded contactors are obliterated.

At the same time the nature of epoxy of molding itself to the shape of the containment and adhesive effect helps in providing a dependable contactor structure.

With the foregoing background in mind, while disclosure provides a reliable contact structure that can produce 100% shielding factor, an exemplary embodiment of the invention also aims to eliminate impedance mismatch during the signal transmission.

The disclosed device can be made up of six-part embodiment; In accordance with one embodiment of this invention, the present invention comprises at least a six piece construction. The contactor provides a first contact means (top probe pins), second contact means (bottom probe pins) which extend above and below the surface of the said first and second contact means respectively to make contact with the DUT; a top plate, bottom plate which are sealed with an insulative material including but not limited to epoxy. The plates serve as the housing for probe pins and are made from conductive materials.

The virtual ground planes created by shorting the housing to the ground pins will provide the shielding for Signal Pin and a good constant control of impedance along the signal path can be achieved. Internally in the contactor, an insulative material such as but not limited to epoxy, functions as a fixture to hold the signal pins as well as to prevent them from being shorted to the housing.

During signal transmissions, interferences from neighboring pins occurs resulting in a noisy and distorted transmitted signals. These phenomena of signal interference from one pin to the adjacent pin are commonly known as crosstalk.

In one example of the invention, the signal pins are shielded 100%, thus offering the most desirable crosstalk performances as opposed to the conventional plastic and/or partially shielded contactors.

With good controls obtained on impedance through methods of shielding, the problem impedance mismatch along the transmission line is further reduced. Smaller mismatch provides good Return Loss.

The ratio of plastic materials existed in the conventional plastic and partially shielded contactors are much higher if compared to embodiments of the invention. The smaller the ratio the lesser the dielectric loss tangent which contributes to the performance of the contact insertion loss of the signal pins. Therefore, with the present invention, the losses that which are normally incurred during transmission in conventional plastic or partially shielded contactors are greatly reduced.

Loop inductance improves tremendously when 100% shielding factor are achieved. Shorter return path together with higher mutual inductance contributes to this significant improvement.

As such, the present invention attains several advantages, some of which are summarized as providing improved shielding against electromagnetic and radio frequency interference in electronic devices reduced forces for attaining and maintaining effective shielding contact; attains full deflection of the contactors of shielding arrangements with reduced force and without deleterious permanent deformation.

The disclosure further provides for long-term consistent and intimate shielding contact and resists permanent deformations which otherwise could defeat effective shielding contact.

The disclosure also assures highly localized contact between the contactors and surrounding structure for effective shielding contact.

The disclosed arrangement also provides a contactor which is shielded from electrical interference brought about by spurious electrical signals coming in from different sources.

DETAILED DESCRIPTION

Figure 1:
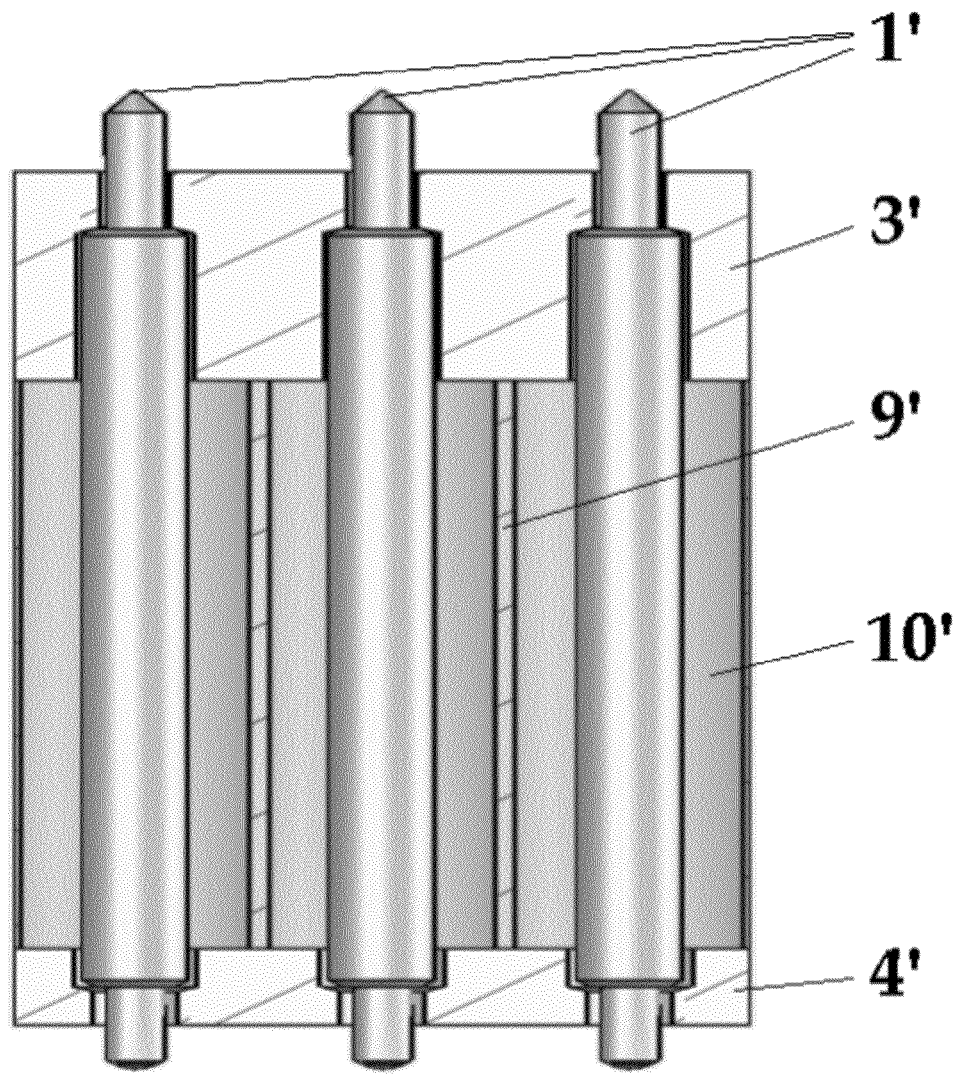
FIG. 1 shows the cross section conventional 3-plate design for probe contactor.

While the making and using of various embodiments of the present invention are discussed in detail below, it should be appreciated that the present invention provides for inventive concepts capable of being embodied in a variety of specific contexts. The specific embodiments discussed herein are merely illustrative of specific manners in which to make and use the invention and are not to be interpreted as limiting the scope of the present invention.

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents which operate in a similar manner to accomplish a similar purpose.

With reference to its orientation in FIG. 1, the conventional 3-plate design for probe contactor for semiconductor device testing usually includes signal pins (F), top plate (3') and the bottom plate (4'), which holds the signal pins (T) that is conducted together with layers of conductive material (9') with air gap (10')—This partially shielded conventional contactor has three plates. The conductive material (9') are shorted to the ground pins (not shown in the picture) thus creating a virtual ground plane that shields the signal pin (1') at a constant impedance. Surrounding the signal pin (1') is the air gap (10') which includes no materials. This air gap (10') is not connected to the signal pin (1'). The top plate (3') and bottom plate (4') are made of engineered plastic materials, serve as the housing to hold the pins in position and prevent them from shorting to the ground. In order to gain a good control over the impedance of a partially shielded contactor, the shielding percentage will have to be maximized, by reducing the plastic materials plates on both the top side (3') and bottom side (4').

Figure 2:
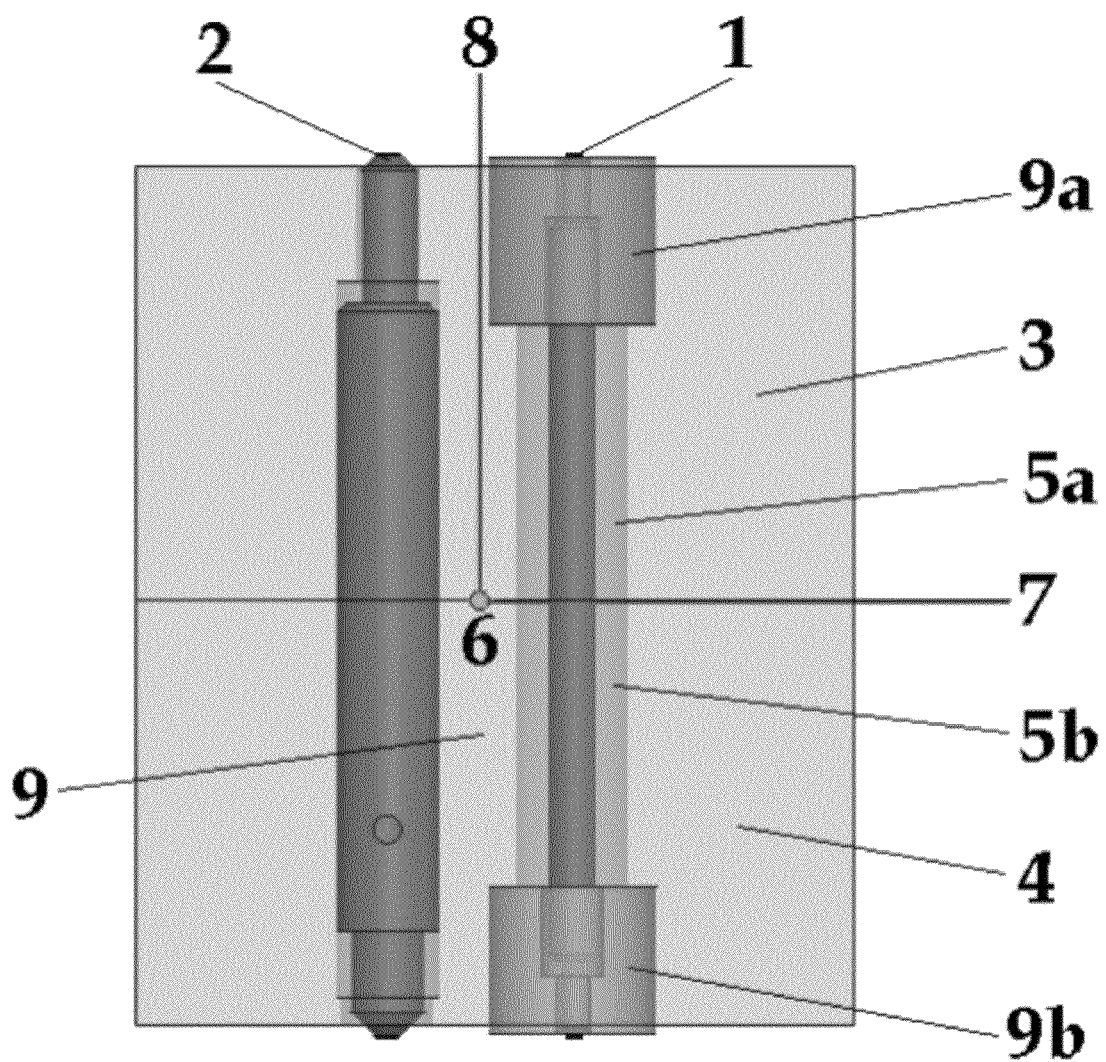
FIG. 2 shows the front cross section view of the present invention

The disclosure provides an improvement in a shielding contactor device in which in the present embodiment as illustrated in FIG. 2. FIG. 2 shows the front view (refer to the X-axis (6) of the design, where Z-axis (8) is at the top and Y-axis (7) is on the right). A top plate (3) is provided with internal air gap (5a) and bottom plate (4) with internal air gap (5b), where top plate (3) and bottom plate (4) are having a conductive material including, but not limited to aluminum or a plastic material that is coated with metallic material such as gold, copper or the like materials.

In FIG. 2, there is illustrated a contactor having plates (3, 4) which serves as the housing for the signal pin (1) wherein said plates are constructed of a conductive material which extends in a longitudinal direction and has a lateral width between laterally opposite said plates (3, 4) respectively. The conductive material may include aluminum or a plastic material that is coated with metallic material such as gold, copper or the like materials. Accordingly, the length of the assembled contactor is totally surrounded by conductive material, thereby providing shielding element. The virtual ground planes created by shorting the housing to provide the shielding for signal pin (1); can eventually be used as other signal pin to achieve good constant control of impedance along the signal paths.

In a preferred embodiment of the subject contactor for forming a plurality of electrical connections between an IC package and a printed circuit board for instance, the said contactor includes a non-conductive substrate or an insulative material preferably epoxy but not limited to epoxy. According to the present invention, a plurality of insulative material (9a, 9b) extending between the top and bottom surfaces thereof, is disposed having the capability to prevent the signal pin (1) from being shorted to the housing, top plate (3) and bottom plate (4). The other function of the epoxy (9a, 9b) is used as a fixture to hold the signal pins (1) together with the top plate (3) and bottom plate (4).

Figure 3:
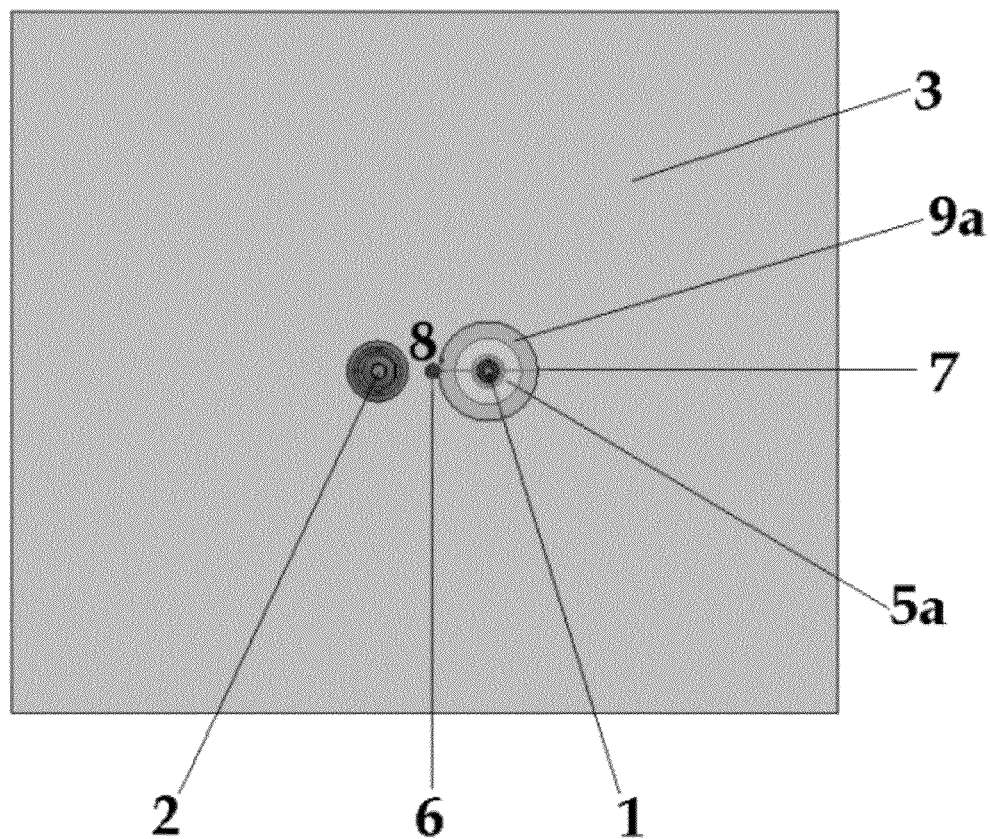
FIG. 3 shows the top view of the present invention

FIG. 3 shows the top view of the present invention (refer to the Z-axis (8) of the design, where X-axis (6) is at the bottom and Y-axis (7) is on the right). Insulative materials (9a) formed within the top probe pin (1) is used in order to solve certain mechanical issues that surfaces in the partially shielded conventional contactors. The said insulative materials (9a) which are inserted into a contactor, constructed on conductive materials hold the pins (1) in position.

Since the housing, which is the top plate (3) and bottom plate (4), is shorted to ground, the signal pin (1) needs such materials (9a, 9b) in order to prevent them from being shorted to ground. Accordingly, such configurations will provide a 100% shielding factor. Based on coaxial concept, such a percentage would provide the most effective and desirable RF performances of a contactor. The internal air gap (5a) exists at the signal pin (1) to further help improve the insertion loss performance. Air, having the lowest dielectric loss tangent value, thus improves the losses incurred during insertion and signal transmissions.

Figure 4:
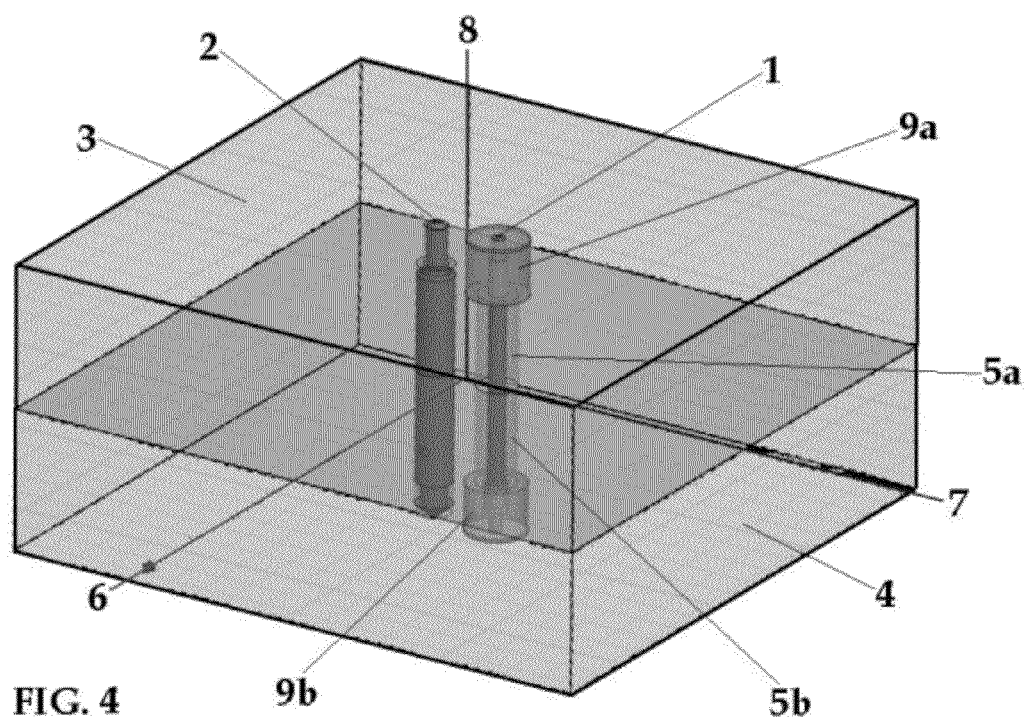
FIG. 4 shows the isometric view of the present invention

FIG. 4 illustrates the isometric view of the present invention (where the Z-axis (8), X-axis (6), and Y-axis (7) are shown). This clearly shows that the position of the insulative materials (9a, 9b) holding the signal pin (1) between the air gap (5a, 5b), together with the housing; top plate and bottom plate (3, 4).

FIG. 4 also shows the position of the signal pin (1) being isolated from the ground pin (2) in order to archive the 100% shielding element, since the ground plane is no longer limited with the top plate and bottom plate (3, 4) of the plastic and partially shielded conventional contactors shown in FIG. 1 (prior art).

It is to be understood that the above detailed description of preferred embodiments of the invention is provided by way of example only. Various details of design, construction and procedure may be modified without departing from the true spirit and scope of the invention, as set forth in the appended claims.

The invention claimed is:

1. A contactor comprising:
    one or more signal pins, a top plate, a bottom plate, the contactor extends in a longitudinal direction and has a lateral width between laterally opposite surfaces of said top and bottom plates, said top plate and said bottom plate including a conductive material; and
    a shielding element comprising a non-conductive material, said non-conductive material includes a plurality of insulative materials having top and bottom surfaces, the insulative materials separate the signal pins from the top and bottom plates;
    wherein said insulative materials include epoxy or engineered plastic; and
    wherein said insulative materials are housed in the top plate and the bottom plate, and are laterally separated to hold opposite ends of at least one of the signal pins, respectively.

2. A contactor as claimed in claim 1, wherein said top plate and said bottom plate are constructed of a conductive material which includes at least one of an aluminum and a plastic material that is coated with metallic material comprising at least one of gold or copper.

3. A contactor as claimed in claim 1, wherein said insulative materials are capable of holding the signal pins together with the top plate and the bottom plate.

4. A contactor according to claim 1, further wherein the top plate has an internal air gap and bottom plate has an internal air gap.

5. A contactor according to claim 4, wherein said contactor includes a single or double ended probe pin.

* * * * *